United States Patent
Chang et al.

(10) Patent No.: US 11,882,773 B2
(45) Date of Patent: Jan. 23, 2024

(54) RESISTIVE RANDOM ACCESS MEMORY AND MANUFACTURING METHOD THEREOF

(71) Applicant: United Microelectronics Corp., Hsinchu (TW)

(72) Inventors: Kai Jiun Chang, Taoyuan (TW); Chun-Hung Cheng, Kaohsiung (TW); Chuan-Fu Wang, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 362 days.

(21) Appl. No.: 17/396,493

(22) Filed: Aug. 6, 2021

(65) Prior Publication Data
US 2023/0027508 A1    Jan. 26, 2023

(30) Foreign Application Priority Data
Jul. 20, 2021    (TW) .................................. 110126609

(51) Int. Cl.
H10N 70/00 (2023.01)
H10N 70/20 (2023.01)

(52) U.S. Cl.
CPC ......... *H10N 70/828* (2023.02); *H10N 70/023* (2023.02); *H10N 70/063* (2023.02); *H10N 70/24* (2023.02); *H10N 70/841* (2023.02); *H10N 70/8833* (2023.02); *H10N 70/8836* (2023.02)

(58) Field of Classification Search
CPC ... H10N 70/828; H10N 70/023; H10N 70/063
See application file for complete search history.

(56) References Cited

U.S. PATENT DOCUMENTS

9,214,628 B2    12/2015    Himeno et al.

*Primary Examiner* — Marvin Payen
(74) *Attorney, Agent, or Firm* — J.C. PATENTS (57) ABSTRACT

Provided are a resistive random access memory (RRAM) and a manufacturing method thereof. The resistive random access memory includes multiple unit structures disposed on a substrate. Each of the unit structures includes a first electrode, a first metal oxide layer, and a spacer. The first electrode is disposed on the substrate. The first metal oxide layer is disposed on the first electrode. The spacer is disposed on sidewalls of the first electrode and the first metal oxide layer. In addition, the resistive random access memory includes a second metal oxide layer and a second electrode. The second metal oxide layer is disposed on the unit structures and is connected to the unit structures. The second electrode is disposed on the second metal oxide layer.

20 Claims, 11 Drawing Sheets

RESISTIVE RANDOM ACCESS MEMORY AND MANUFACTURING METHOD THEREOF

CROSS-REFERENCE TO RELATED APPLICATION

This application claims the priority benefit of Taiwan application serial no. 110126609, filed on Jul. 20, 2021. The entirety of the above-mentioned patent application is hereby incorporated by reference herein and made a part of this specification.

BACKGROUND

Technical Field

The disclosure relates to a memory and a manufacturing method thereof, and particularly relates to a resistive random access memory (RRAM) and a manufacturing method thereof.

Description of Related Art

The resistive random access memory has advantages such as fast operation speed and low power consumption, so the resistive random access memory has become a type of non-volatile memory that has been widely studied in recent years. Generally speaking, the resistive random access memory includes an upper electrode, a lower electrode, and a variable resistance layer disposed between the upper electrode and the lower electrode.

During the period of operating the resistive random access memory, when a voltage is applied to the upper electrode and the lower electrode, a conductive path (usually referred to as a conductive filament (CF)) may be formed in the variable resistance layer to perform a set operation or the conductive path may be disconnected to perform a reset operation, so as to provide related memory functions.

SUMMARY

The disclosure provides a resistive random access memory whose electrodes may be used as bit lines when operating the resistive random access memory.

The disclosure provides a manufacturing method of a resistive random access memory. An upper electrode may be used as a bit line when operating the resistive random access memory, so that there is no need to additionally form a bit line electrically connected to the resistive random access memory.

The resistive random access memory of the disclosure includes multiple unit structures disposed on a substrate. Each of the unit structures includes a first electrode, a first metal oxide layer, and a spacer. The first electrode is disposed on the substrate. The first metal oxide layer is disposed on the first electrode. The spacer is disposed on sidewalls of the first electrode and the first metal oxide layer. In addition, the resistive random access memory includes a second metal oxide layer and a second electrode. The second metal oxide layer is disposed on the unit structures and is connected to the unit structures. The second electrode is disposed on the second metal oxide layer.

In an embodiment of the resistive random access memory of the disclosure, in each of the unit structures, a top width is less than or substantially equal to a bottom width.

In an embodiment of the resistive random access memory of the disclosure, a material of the first electrode includes titanium (Ti), tantalum (Ta), titanium nitride (TiN), tantalum nitride (TaN), aluminum titanium nitride (TiAlN), titanium tungsten (TiW), platinum (Pt), iridium (Ir), tungsten (W), ruthenium (Ru), graphite, or a combination thereof.

In an embodiment of the resistive random access memory of the disclosure, a material of the second electrode includes titanium, tantalum, titanium nitride, tantalum nitride, aluminum titanium nitride, titanium tungsten, platinum, iridium, tungsten, ruthenium, graphite, or a combination thereof.

In an embodiment of the resistive random access memory of the disclosure, the resistive random access memory further includes a conductive barrier layer disposed between the second electrode and the second metal oxide layer.

In an embodiment of the resistive random access memory of the disclosure, a material of the conductive barrier layer includes iridium.

In an embodiment of the resistive random access memory of the disclosure, a material of the first metal oxide layer includes hafnium oxide ($HfO_2$), zirconium oxide ($ZrO_2$), zirconia hafnium (HfZrO), hafnium alumina (HfAlO), hafnium oxynitride (HfON), hafnium silicon oxide (HfSiO), hafnium strontium oxide (HfSrO), hafnium yttrium oxide (HfYO), or a combination thereof.

In an embodiment of the resistive random access memory of the disclosure, a material of the second metal oxide layer includes hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

In an embodiment of the resistive random access memory of the disclosure, the first metal oxide layer is a metal-rich layer and the second metal oxide layer is an oxygen-rich layer.

The manufacturing method of the resistive random access memory of the disclosure includes the following steps. Multiple unit structures are formed on the substrate. Each of the unit structures includes a first electrode, a first metal oxide layer, and a spacer. The first electrode is formed on the substrate. The first metal oxide layer is formed on the first electrode. The spacer is formed on sidewalls of the first electrode and the first metal oxide layer. A second metal oxide layer is formed on the unit structures. The second metal oxide layer is connected to the unit structures. A second electrode is formed on the second metal oxide layer.

In an embodiment of the manufacturing method of the resistive random access memory of the disclosure, in each of the unit structures, a top width is less than or substantially equal to a bottom width.

In an embodiment of the manufacturing method of the resistive random access memory of the disclosure, a material of the first electrode includes titanium, tantalum, titanium nitride, tantalum nitride, aluminum titanium nitride, titanium tungsten, platinum, iridium, tungsten, ruthenium, graphite, or a combination thereof.

In an embodiment of the manufacturing method of the resistive random access memory of the disclosure, a material of the second electrode includes titanium, tantalum, titanium nitride, tantalum nitride, aluminum titanium nitride, titanium tungsten, platinum, iridium, tungsten, ruthenium, graphite, or a combination thereof.

In an embodiment of the manufacturing method of the resistive random access memory of the disclosure, after forming the second metal oxide layer and before forming the second electrode, the manufacturing method further includes the following step. A conductive barrier layer is formed on the second metal oxide layer.

In an embodiment of the manufacturing method of the resistive random access memory of the disclosure, a material of the conductive barrier layer includes iridium.

In an embodiment of the manufacturing method of the resistive random access memory of the disclosure, a material of the first metal oxide layer includes hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

In an embodiment of the manufacturing method of the resistive random access memory of the disclosure, a material of the second metal oxide layer includes hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

In an embodiment of the manufacturing method of the resistive random access memory of the disclosure, the first metal oxide layer is a metal-rich layer and the second metal oxide layer is an oxygen-rich layer.

In an embodiment of the manufacturing method of the resistive random access memory of the disclosure, a forming method of the unit structures includes the following steps. An electrode material layer is formed on the substrate. A metal oxide material layer is formed on the electrode material layer. The electrode material layer and the metal oxide material layer are patterned to form multiple units. The spacer is formed on sidewalls of the units.

In an embodiment of the manufacturing method of the resistive random access memory of the disclosure, a patterning method of the electrode material layer and the metal oxide material layer includes the following step. A double patterning process is performed.

In summary, in the resistive random access memory of the disclosure, the second electrode used as the upper electrode and the second metal oxide layer located thereunder are connected to the structure units at the same time, and the second electrode may be electrically connected to an external voltage source. Therefore, the upper electrode (second electrode) in the resistive random access memory of the disclosure may be used as a bit line when operating the resistive random access memory, so that there is no need to additionally provide a bit line electrically connected to the resistive random access memory. In this way, the resistive random access memory of the disclosure may have lower structural and processing complexity.

In order for the features and advantages of the disclosure to be more comprehensible, the following specific embodiments are described in detail in conjunction with the accompanying drawings.

DETAILED DESCRIPTION OF DISCLOSED EMBODIMENTS

The following embodiments are exemplified in conjunction with the drawings for detailed description, but the provided embodiments are not intended to limit the scope of the disclosure. In addition, the drawings are for illustrative purposes only and are not drawn according to the original dimensions. In order to facilitate understanding, the same elements will be described with the same reference numerals in the following description.

Terms such as "contain", "include", and "have" used herein are all open terms, which refer to "containing but not limited to".

When terms such as "first" and "second" are used to describe elements, the terms are only used to distinguish the elements from each other and do not limit the order or importance of the elements. Therefore, in some cases, a first element may also be referred to as a second element and the second element may also be referred to as the first element, which does not deviate from the scope of the disclosure.

In addition, directional terms such as "on" and "under" mentioned herein are only used to refer to the directions of the drawings and are not used to limit the disclosure. Therefore, it should be understood that "on" may be used interchangeably with "under", and when an element such as a layer or a film is placed "on" another element, the element may be directly placed on the other element or there may be an intermediate element. On the other hand, when an element is described to be placed "directly" on another element, there is no intermediate element between the two.

FIG. 1A to FIG. 1E are top schematic views of a manufacturing process of a resistive random access memory according to an embodiment of the disclosure. FIG. 2A to FIG. 2E are cross-sectional schematic views of the manufacturing process of the resistive random access memory of the embodiment of the disclosure along an A-A section line in FIG. 1A to FIG. 1E.

Figure 1A:
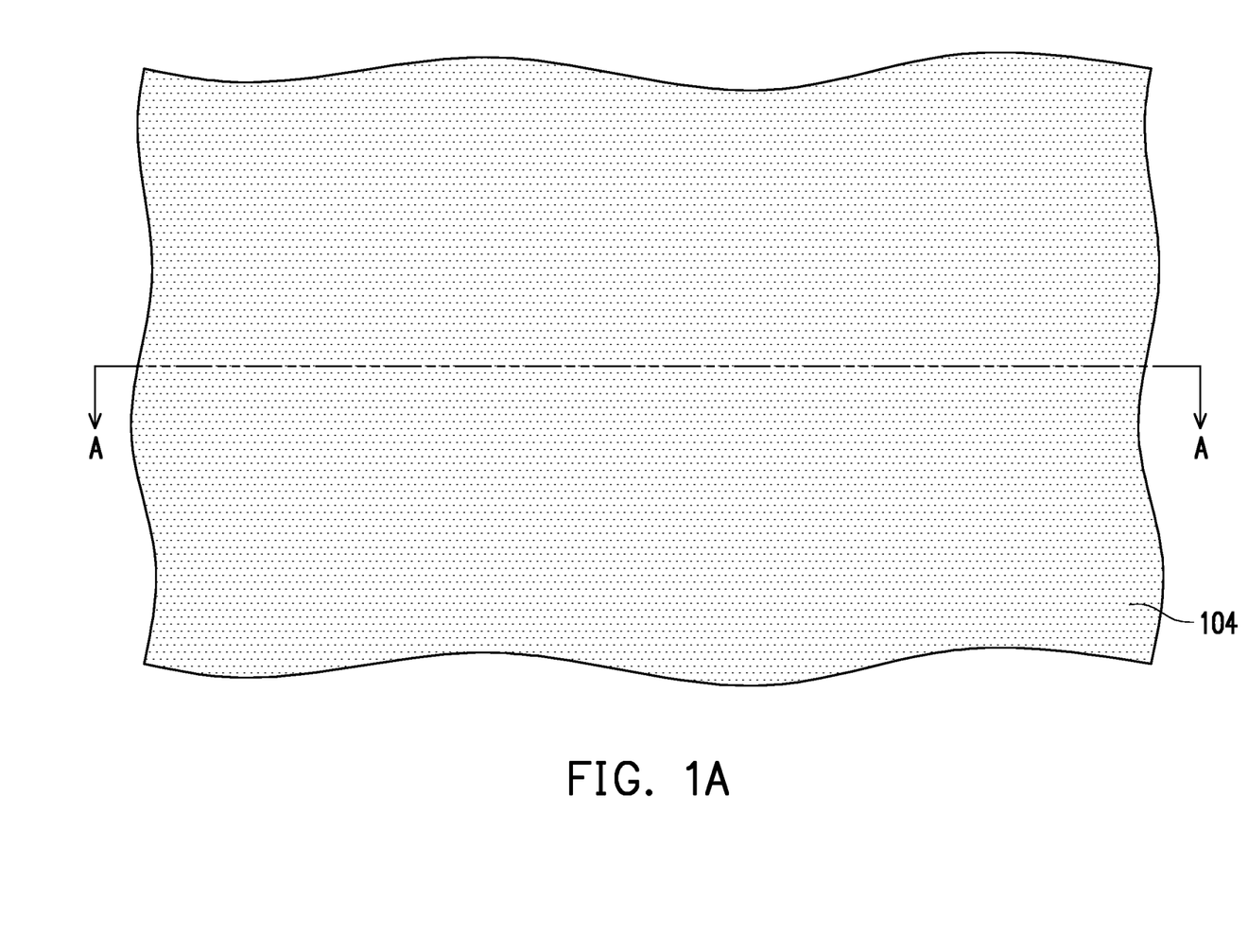
FIG. 1A to FIG. 1E are top schematic views of a manufacturing process of a resistive random access memory according to an embodiment of the disclosure.
Figure 2A:
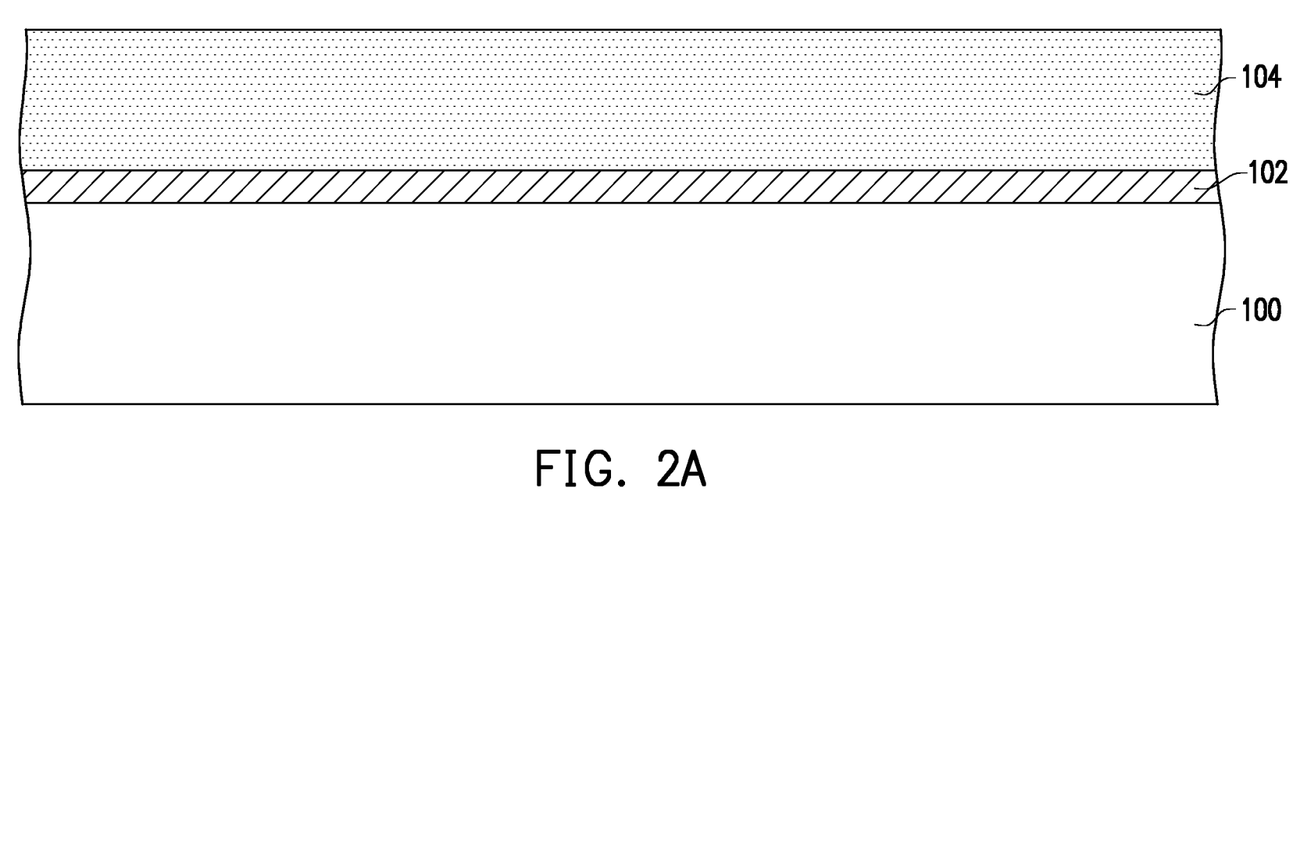
FIG. 2A to FIG. 2E are cross-sectional schematic views of the manufacturing process of the resistive random access memory along an A-A section line in FIG. 1A to FIG. 1E.

First, referring to FIG. 1A and FIG. 2A at the same time, a substrate 100 is provided. In the embodiment, the substrate 100 is a dielectric substrate. The substrate 100 is, for example, a dielectric layer formed on a silicon substrate or a silicon on insulator (SOI) substrate. In addition, a contact or a via for connecting to a lower electrode of the resistive random access memory is formed in the substrate 100. In order for the drawings to be clear and to facilitate explanation, the contact or the via, a circuit layer formed in the dielectric layer, a semiconductor element (such as a transistor) covered by the dielectric layer, etc. are not shown.

Then, an electrode material layer 102 is formed on the substrate 100. The electrode material layer 102 is configured to form the lower electrode of the resistive random access memory according to the embodiment of the disclosure. The material of the electrode material layer 102 is, for example, titanium, tantalum, titanium nitride, tantalum nitride, aluminum titanium nitride, titanium tungsten, platinum, iridium, tungsten, ruthenium, graphite, or a combination thereof. Preferably, the material of the electrode material layer 102 may be titanium nitride, tantalum nitride, or a combination thereof. After that, a metal oxide material layer 104 is formed on the electrode material layer 102. The material of the metal oxide material layer 104 is, for example, hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof. Furthermore, in the embodiment, the metal oxide material layer 104 is a metal-rich layer with metal content higher than oxygen content. The forming method of the metal oxide material layer 104 is, for example, a chemical vapor deposition (CVD) process.

In addition, in the embodiment, one layer of the metal oxide material layer 104 is formed on the electrode material layer 102, but the disclosure is not limited thereto. In other embodiments, multiple layers of the metal oxide material layer may be formed on the electrode material layer 102, and the metal oxide material layers are all metal-rich layers with metal content higher than oxygen content.

Figure 1B:
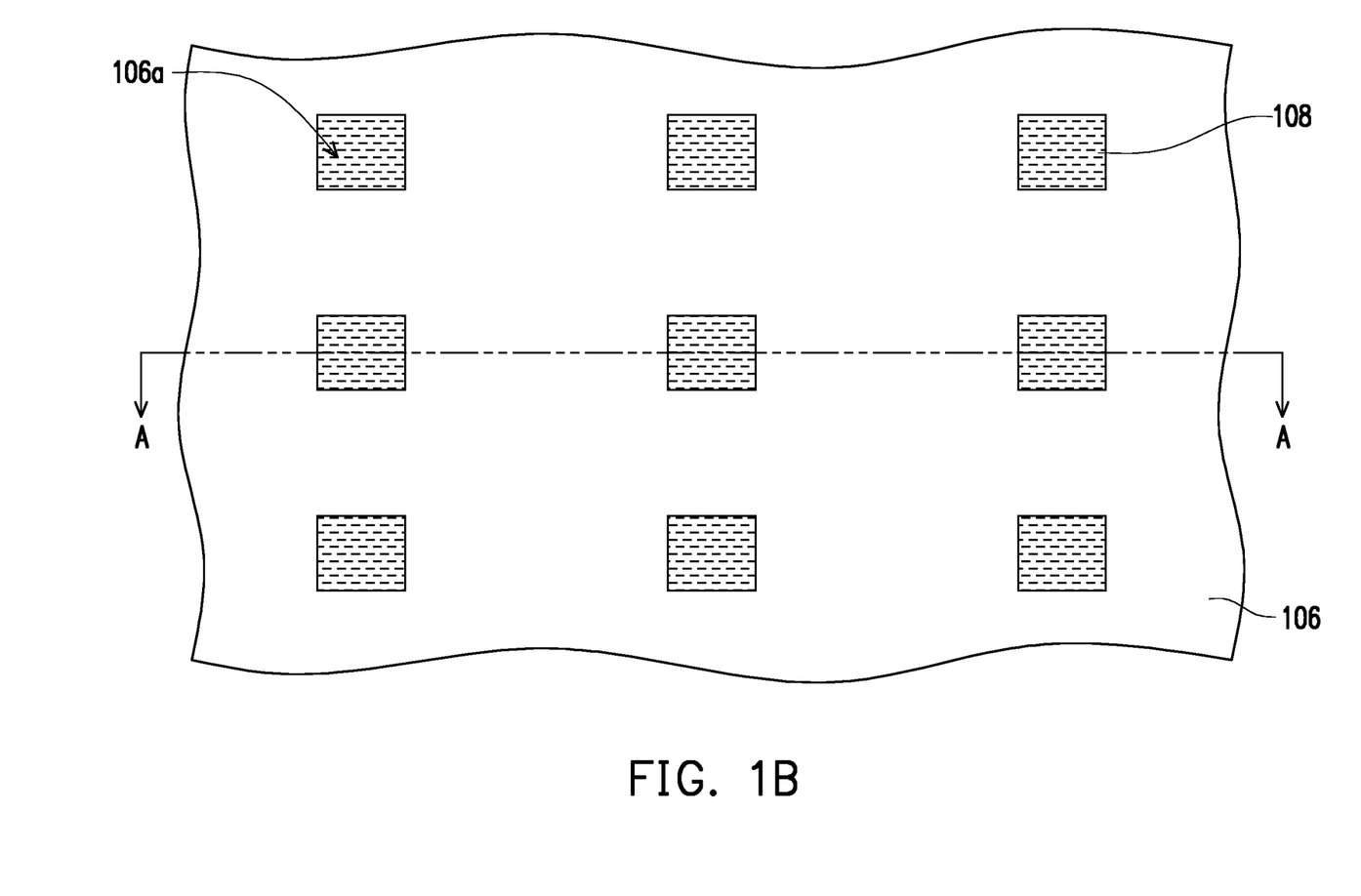
Figure 2B:
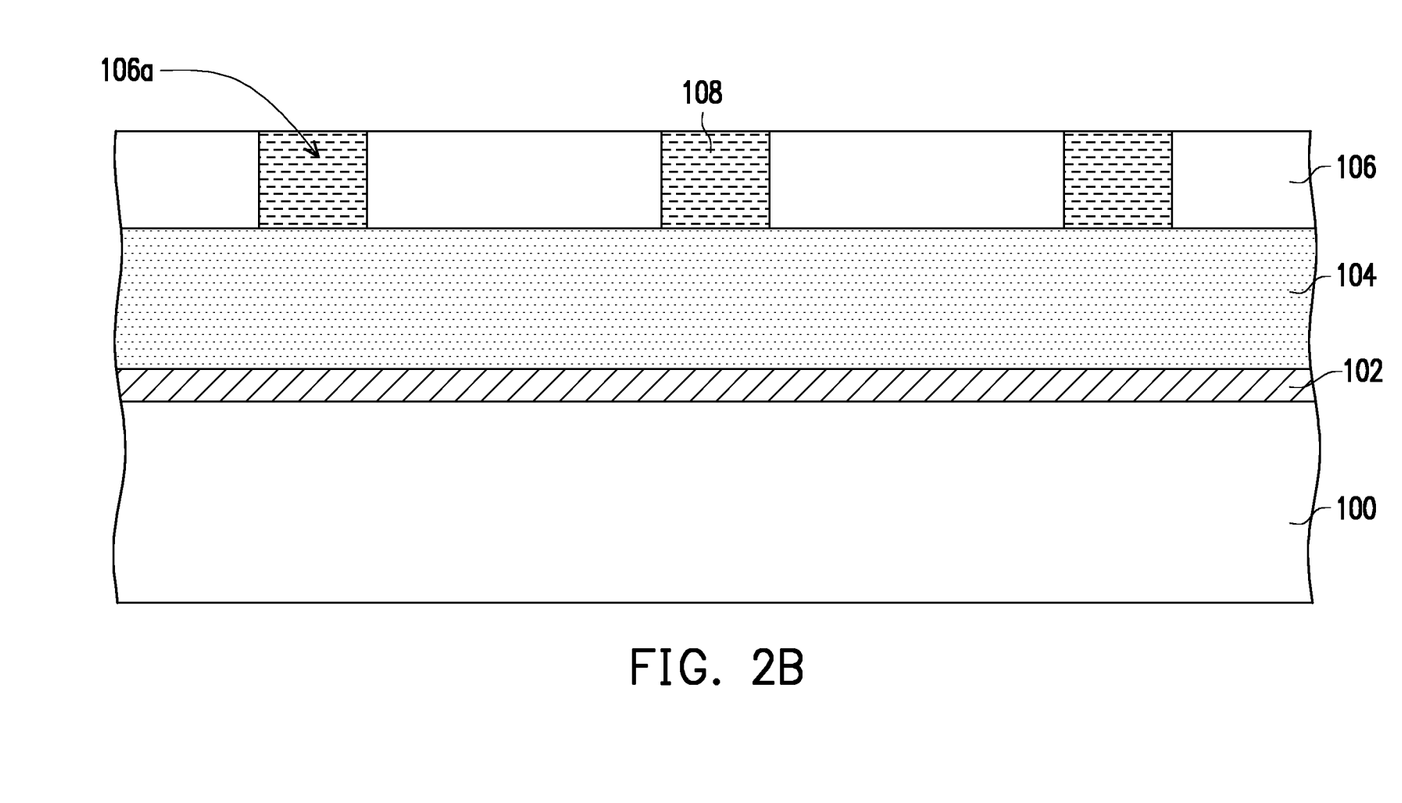

Next, referring to FIG. 1B and FIG. 2B at the same time, a patterning hardmask layer 106 is formed on the metal oxide material layer 104. The material of the patterning hardmask layer 106 is, for example, silicon oxide. The patterning hardmask layer 106 has an opening 106a exposing a portion of the metal oxide material layer 104. In the embodiment, a region exposed by the patterning hardmask layer 106 corresponds to a region of a memory unit that subsequently forms the resistive random access memory. Then, a hardmask layer 108 is filled in the opening 106a of the patterning hardmask layer 106. The material of the hardmask layer 108 is, for example, silicon nitride. The hardmask layer 108 is formed, for example, by first forming a hardmask material layer on the patterning hardmask layer 106 and filling the opening 106a, and then removing a hardmask material layer outside the opening 106a.

Figure 1C:
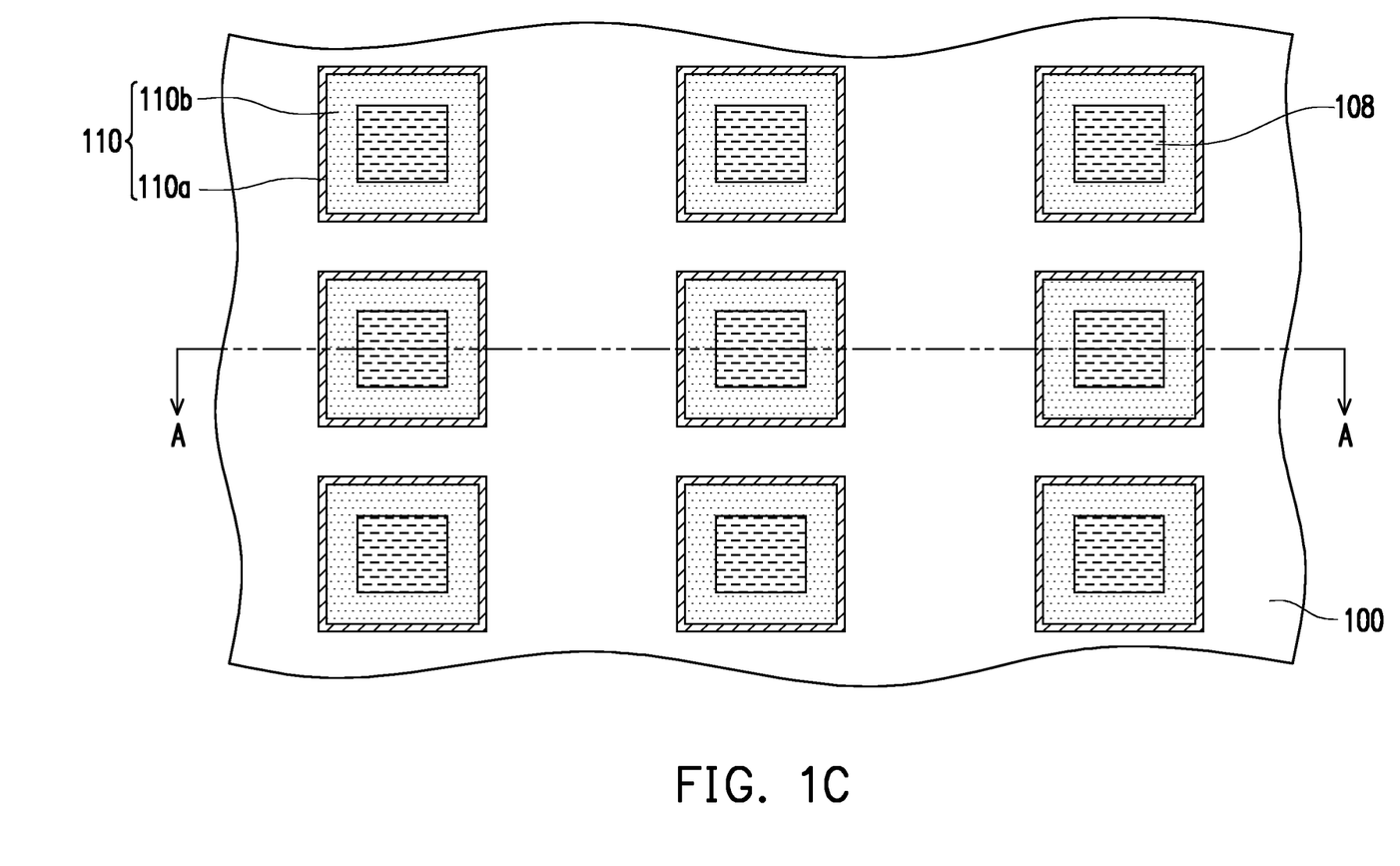
Figure 2C:
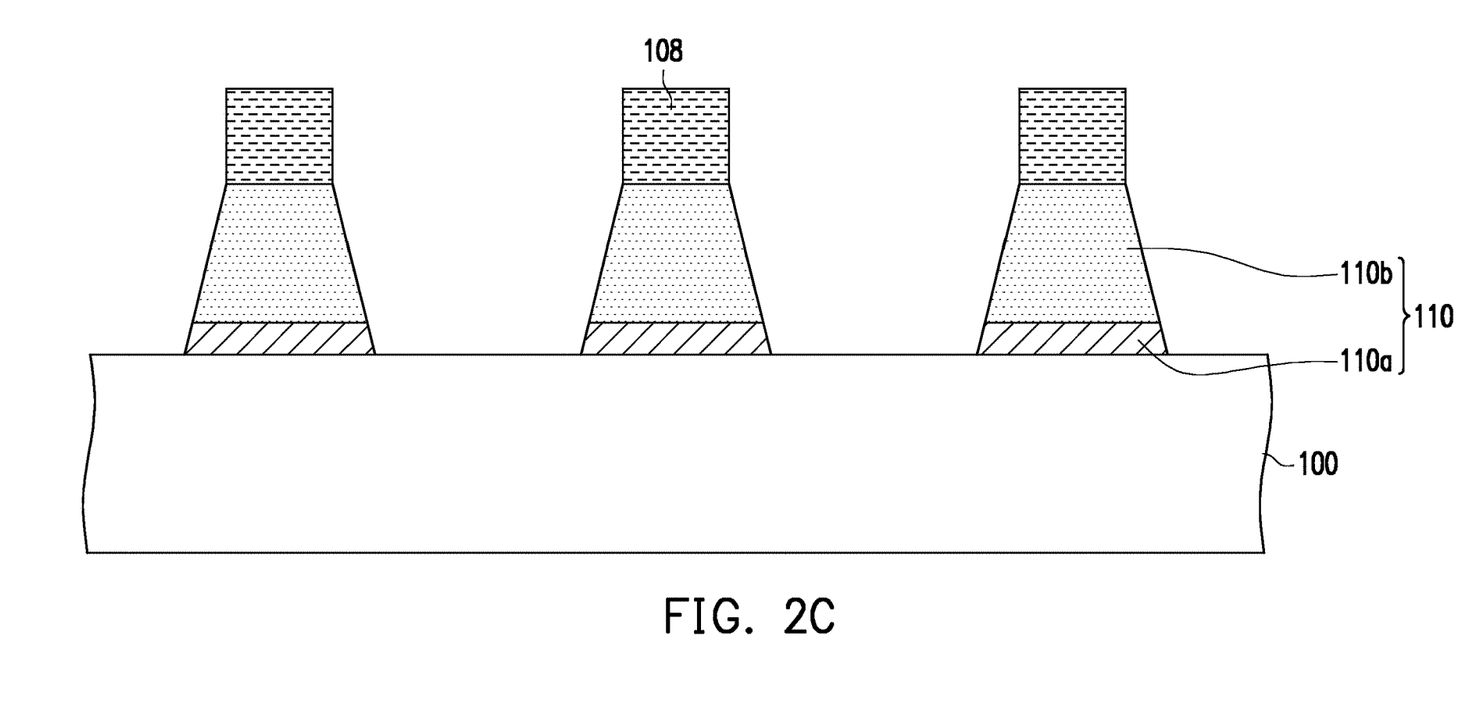

Then, referring to FIG. 1C and FIG. 2C at the same time, the patterning hardmask layer 106 is removed. Next, using the hardmask layer 108 as an etching mask, an anisotropic etching process is performed to remove a portion of the metal oxide material layer 104 and a portion of the electrode material layer 102. In this way, multiple units 110 are formed on the substrate 100, and each unit 110 includes a first electrode 110a formed by the electrode material layer 102 and a first metal oxide layer 110b formed by the metal oxide material layer 104. The first electrode 110a is used as the lower electrode of the resistive random access memory of the embodiment.

In the embodiment, the patterning process for forming the unit 110 in FIG. 1B to FIG. 1C and FIG. 2B to FIG. 2C is a conventional double patterning process, but the disclosure is not limited thereto. In other embodiments, other types of patterning processes may be adopted to form the unit 110 according to actual requirements.

In the embodiment, each formed unit 110 has a trapezoidal cross section. In other words, in each unit 110, a top width is less than a bottom width. In detail, in each unit 110, a top surface area of the first metal oxide layer 110b is less than a bottom surface area of the first electrode 110a. However, the disclosure is not limited thereto. In other embodiments, each formed unit 110 may have a rectangular cross section, that is, in each unit 110, the top surface area of the first metal oxide layer 110b may be substantially equal to the bottom surface area of the first electrode 110a.

Figure 1D:
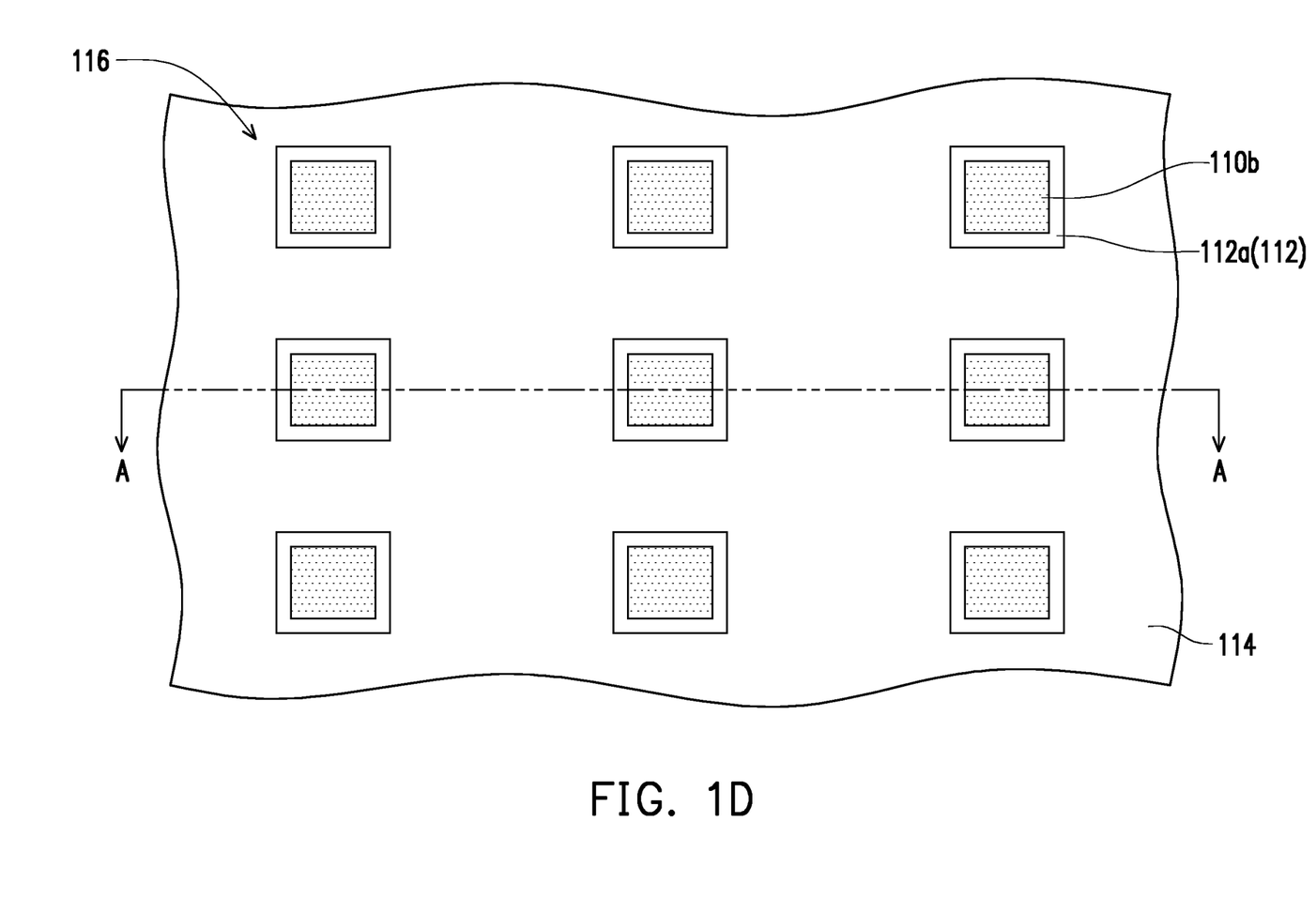
Figure 2D:
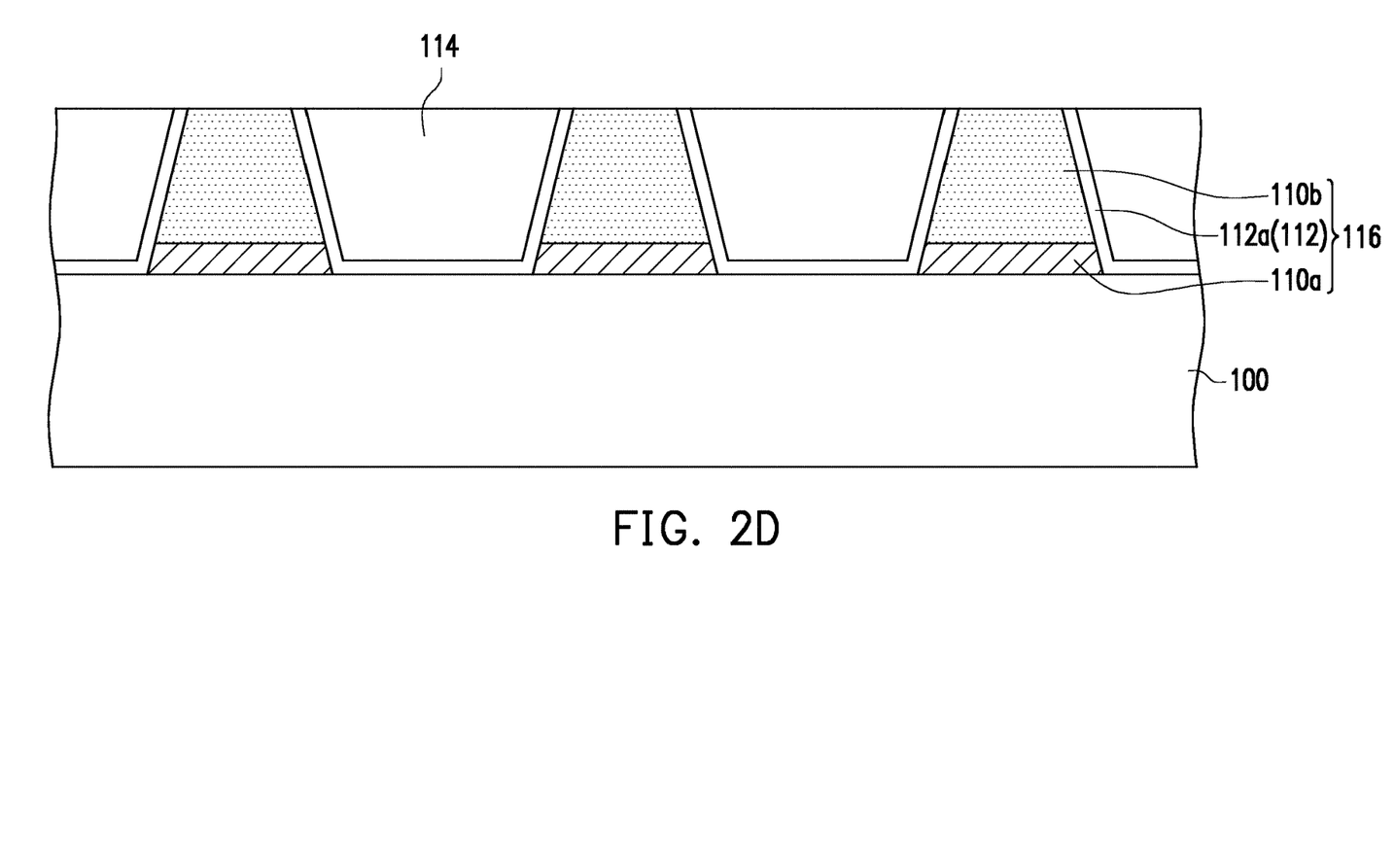

Next, referring to FIG. 1D and FIG. 2D at the same time, the hardmask layer 108 is removed. Then, a spacer material layer 112 is conformally formed on the substrate 100. The material of the spacer material layer 112 is, for example, silicon nitride. After that, a dielectric layer 114 is formed on the spacer material layer 112. The dielectric layer 114 is used as an inter-metal dielectric (IMD). The dielectric layer 114 covers all the units 110 and the spacer material layer 112 on the substrate 100. Then, a planarization process is performed to remove a portion of the dielectric layer 114 and a portion of the spacer material layer 112 until a top surface of the first metal oxide layer 110b is exposed. In the embodiment, the planarization process is, for example, a chemical mechanical polishing (CMP) process. After performing the planarization process, the spacer material layer 112 remaining on a sidewall of each unit 110 is formed into a spacer 112a. In this way, multiple unit structures 116 are formed on the substrate 100, and each unit structure 116 includes the first electrode 110a, the first metal oxide layer 110b, and the spacer 112a. In addition, in each unit structure 116, a top width is less than a bottom width.

Figure 1E:
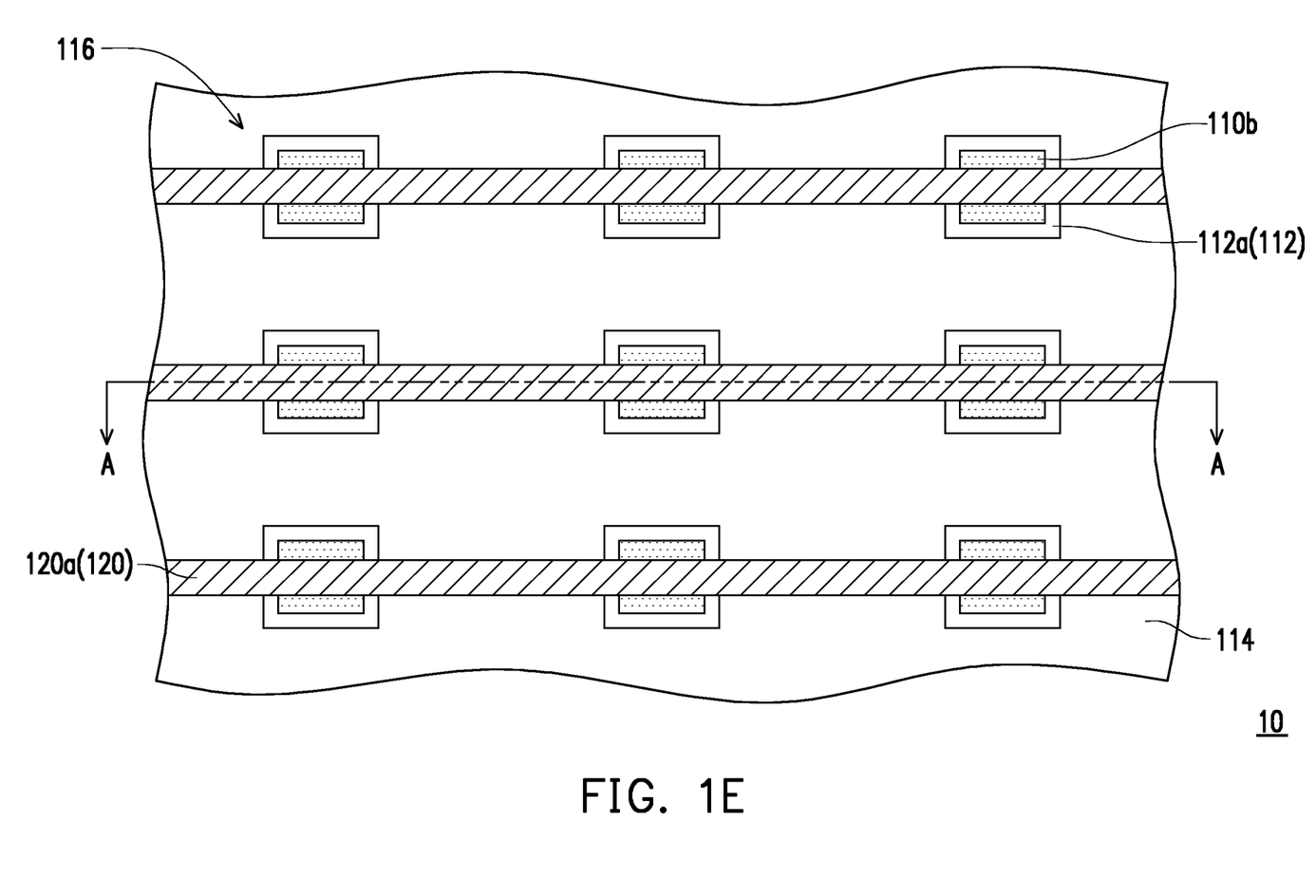
Figure 2E:
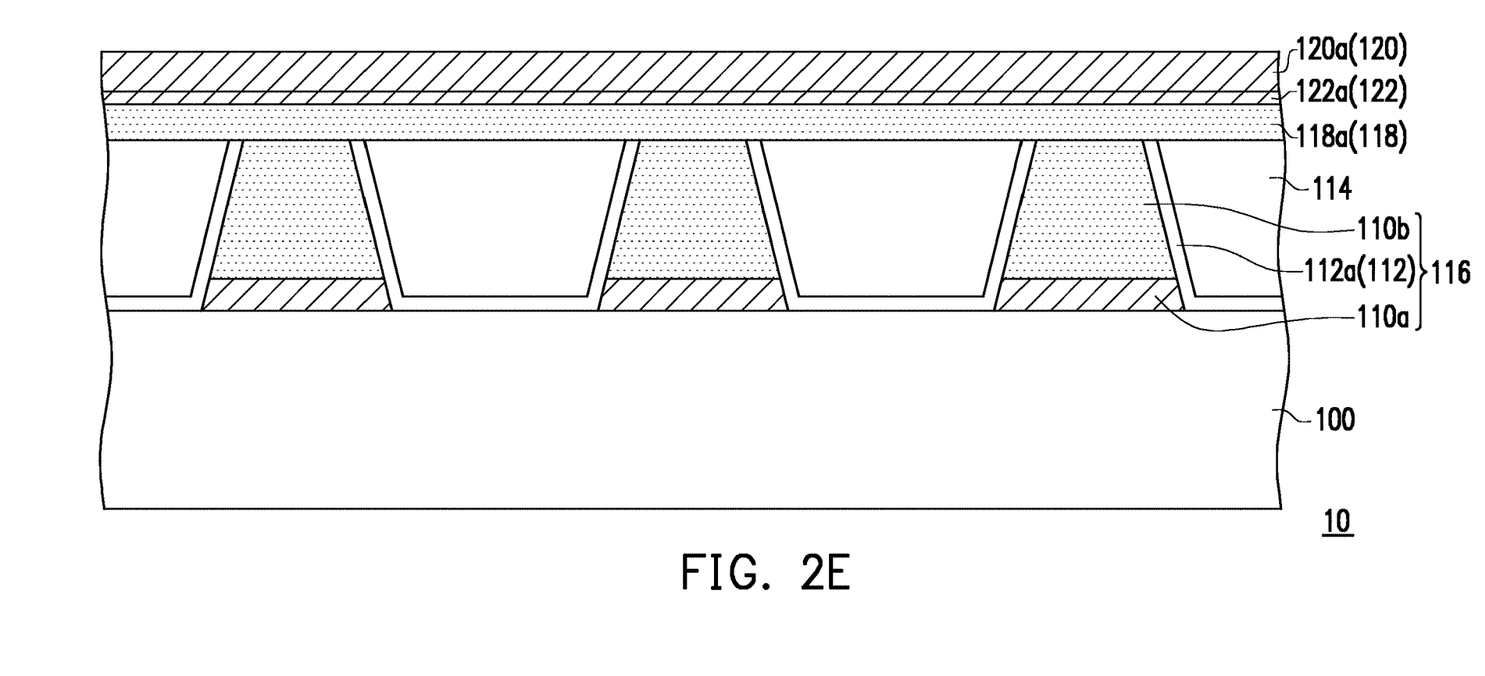

After that, referring to FIG. 1E and FIG. 2E at the same time, a metal oxide material layer 118 is formed on the dielectric layer 114. The material of the metal oxide material layer 118 is, for example, hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof. Furthermore, the metal oxide material layer 118 is an oxygen-rich layer with oxygen content higher than metal content. The forming method of the metal oxide material layer 118 is, for example, a chemical vapor deposition process. Then, an electrode material layer 120 is formed on the metal oxide material layer 118. The electrode material layer 120 is configured to form an upper electrode of the resistive random access memory of the embodiment of the disclosure. The material of the electrode material layer 120 is, for example, titanium, tantalum, titanium nitride, tantalum nitride, aluminum titanium nitride, titanium tungsten, platinum, iridium, tungsten, ruthenium, graphite, or a combination thereof. Preferably, the material of the electrode material layer 120 may be titanium nitride, tantalum nitride, or a combination thereof.

In addition, in the embodiment, after forming the metal oxide material layer 118 and before forming the electrode material layer 120, a conductive barrier material layer 122 may be selectively formed on the metal oxide material layer 118. The material of the conductive barrier material layer 122 is, for example, iridium.

Then, a patterning process is performed on the electrode material layer 120, the conductive barrier material layer 122, and the metal oxide material layer 118 to form a second electrode 120a, a conductive barrier layer 122a, and a second metal oxide layer 118a. In the embodiment, after performing the patterning process on the electrode material layer 120, the conductive barrier material layer 122, and the metal oxide material layer 118, multiple second electrodes 120a disposed in parallel to each other are formed, and the conductive barrier layer 122a and the second metal oxide layer 118a are disposed in stack between the second electrode 120a and the dielectric layer 114. In addition, the second metal oxide layer 118a is connected to the first metal oxide layer 110b and the spacer 112a of the unit structure 116 exposed by the dielectric layer 114. In this way, a resistive random access memory 10 of the embodiment is formed.

Figure 3:
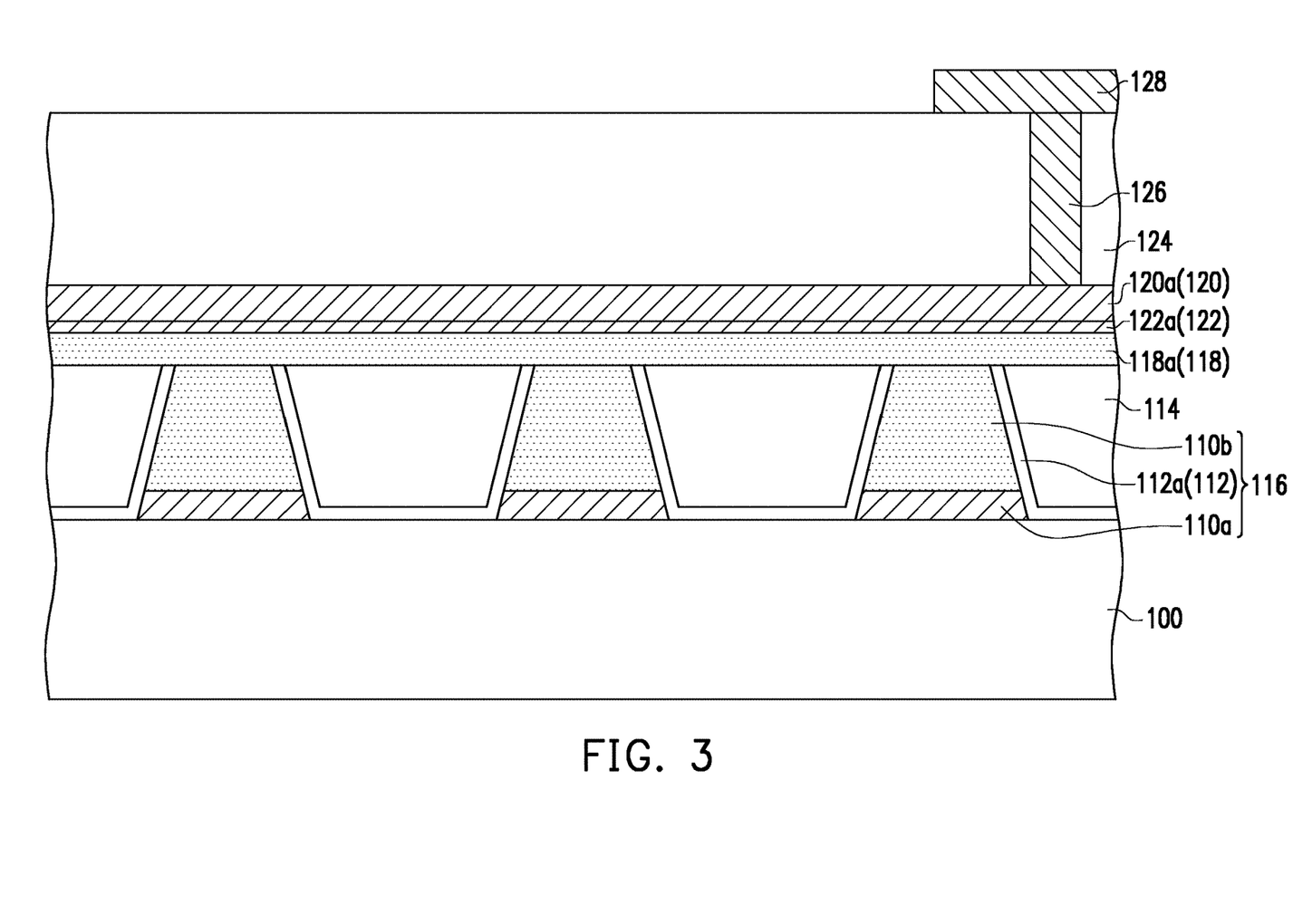
FIG. 3 is a cross-sectional schematic view of a subsequent manufacturing process of the resistive random access memory according to an embodiment of the disclosure.

As shown in FIG. 1E, each second electrode 120a extends on the dielectric layer 114, so that the second electrode 120a and the second metal oxide layer 118a located thereunder can be connected in series with multiple (that is, 3 in the embodiment, but the disclosure is not limited thereto) unit structures 116. After that, the subsequent process may be performed. For example, as shown in FIG. 3, a dielectric layer 124 may be formed on the dielectric layer 114. Then, a via 126 is formed in the dielectric layer 124, and a circuit layer 128 connected to the via 126 is formed on the dielectric layer 124.

Hereinafter, the resistive random access memory 10 will be taken as an example to describe the resistive random access memory of the disclosure.

Referring to FIG. 1E and FIG. 2E, in the resistive random access memory 10, multiple unit structures 116 are disposed on the substrate 100. Each unit structure 116 includes the first electrode 110a disposed on the substrate 100, the first metal oxide layer 110b disposed on the first electrode 110a, and the spacer 112a disposed on the sidewalls of the first electrode 110a and the first metal oxide layer 110b. In addition, the second metal oxide layer 118a is disposed on the unit structures 116 and is connected to the unit structures 116. The second electrode 120a is disposed on the second metal oxide layer 118a, and the conductive barrier layer 122a is disposed between the second electrode 120a and the second metal oxide layer 118a. The first electrode 110a and the second electrode 120a are respectively used as the upper electrode and the lower electrode of the resistive random access memory 10. The second metal oxide layer 118a with oxygen content higher than metal content is used as a variable resistance layer of the resistive random access memory 10.

When operating the resistive random access memory 10, voltages may be respectively applied to the first electrode 110a and the second electrode 120a to form a conductive path (conductive filament) in the second metal oxide layer 118a to perform a set operation or to disconnect the conductive path to perform a reset operation.

In the embodiment, the conductive barrier layer 122a is disposed between the second metal oxide layer 118a and the second electrode 120a. During the period of operating the resistive random access memory 10, the conductive barrier layer 122a does not react with oxygen from the second metal oxide layer 118a, so as to prevent the second electrode 120a from affecting the efficacy of the resistive random access memory 10 due to reaction with oxygen.

In addition, in each unit structure 116, the top width is less than the bottom width, the second metal oxide layer 118a is connected to the top of the unit structure 116 (the top surface of the first metal oxide layer 110b), and the spacer 112a is disposed on the sidewalls of the first electrode 110a and the first metal oxide layer 110b. Therefore, when operating the resistive random access memory 10, oxygen vacancy may be effectively confined in a region R directly above the top of the unit structure 116 (the top surface of the first metal oxide layer 110b). In this way, during the period of forming the resistive random access memory 10, tunneling current may be effectively reduced. Thereby, the second metal oxide layer 118a does not need to have a large thickness, so that the second metal oxide layer 118a may have a large oxygen vacancy density during the period of the set operation of the resistive random access memory 10 to facilitate the formation of the conductive path (conductive filament), and so that the resistive random access memory 10 has higher reliability.

In addition, in the resistive random access memory 10, the second electrode 120a and the second metal oxide layer 118a located thereunder are connected to the structure units 116 at the same time, and the second electrode 120a may be connected to an external voltage source through the via and the circuit (as shown in FIG. 3). Therefore, the second electrode 120a may be regarded as a bit line when operating the resistive random access memory 10. In this way, there is no need to additionally provide a bit line that connects multiple memory units including the upper electrode, the variable resistance layer, and the lower electrode in series as in the prior art. In other words, the resistive random access memory 10 of the embodiment may have lower structural and processing complexity than the prior art.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be determined by the scope of the appended claims.

What is claimed is:

1. A resistive random access memory, comprising:
   a plurality of unit structures, disposed on a substrate, wherein each of the plurality of unit structures comprises:
   a first electrode, disposed on the substrate;
   a first metal oxide layer, disposed on the first electrode; and
   a spacer, disposed on sidewalls of the first electrode and the first metal oxide layer;
   a second metal oxide layer, disposed on the plurality of unit structures and connected to the plurality of unit structures; and
   a second electrode, disposed on the second metal oxide layer.

2. The resistive random access memory according to claim 1, wherein in each of the plurality of unit structures, a top width is less than or substantially equal to a bottom width.

3. The resistive random access memory according to claim 1, wherein a material of the first electrode comprises titanium, tantalum, titanium nitride, tantalum nitride, aluminum titanium nitride, titanium tungsten, platinum, iridium, tungsten, ruthenium, graphite, or a combination thereof.

4. The resistive random access memory according to claim 1, wherein a material of the second electrode comprises titanium, tantalum, titanium nitride, tantalum nitride, aluminum titanium nitride, titanium tungsten, platinum, iridium, tungsten, ruthenium, graphite, or a combination thereof.

5. The resistive random access memory according to claim 1, further comprising a conductive barrier layer, disposed between the second electrode and the second metal oxide layer.

6. The resistive random access memory according to claim 5, wherein a material of the conductive barrier layer comprises iridium.

7. The resistive random access memory according to claim 1, wherein a material of the first metal oxide layer comprises hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

8. The resistive random access memory according to claim 1, wherein a material of the second metal oxide layer comprises hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

9. The resistive random access memory according to claim 1, wherein the first metal oxide layer is a metal-rich layer and the second metal oxide layer is an oxygen-rich layer.

10. A manufacturing method of a resistive random access memory, comprising:
    forming a plurality of unit structures on a substrate, wherein each of the plurality of unit structures comprises:
    a first electrode, formed on the substrate;

a first metal oxide layer, formed on the first electrode; and a spacer, formed on sidewalls of the first electrode and the first metal oxide layer;

forming a second metal oxide layer on the plurality of unit structures, wherein the second metal oxide layer is connected to the plurality of unit structures; and forming a second electrode on the second metal oxide layer.

11. The manufacturing method of the resistive random access memory according to claim 10, wherein in each of the plurality of unit structures, a top width is less than or substantially equal to a bottom width.

12. The manufacturing method of the resistive random access memory according to claim 10, wherein a material of the first electrode comprises titanium, tantalum, titanium nitride, tantalum nitride, aluminum titanium nitride, titanium tungsten, platinum, iridium, tungsten, ruthenium, graphite, or a combination thereof.

13. The manufacturing method of the resistive random access memory according to claim 10, wherein a material of the second electrode comprises titanium, tantalum, titanium nitride, tantalum nitride, aluminum titanium nitride, titanium tungsten, platinum, iridium, tungsten, ruthenium, graphite, or a combination thereof.

14. The manufacturing method of the resistive random access memory according to claim 10, wherein after forming the second metal oxide layer and before forming the second electrode, the manufacturing method further comprises forming a conductive barrier layer on the second metal oxide layer.

15. The manufacturing method of the resistive random access memory according to claim 14, wherein the conductive barrier layer comprises iridium.

16. The manufacturing method of the resistive random access memory according to claim 10, wherein a material of the first metal oxide layer comprises hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

17. The manufacturing method of the resistive random access memory according to claim 10, wherein a material of the second metal oxide layer comprises hafnium oxide, zirconium oxide, hafnium zirconium oxide, hafnium aluminum oxide, hafnium oxynitride, hafnium silicon oxide, hafnium strontium oxide, hafnium yttrium oxide, or a combination thereof.

18. The manufacturing method of the resistive random access memory according to claim 10, wherein the first metal oxide layer is a metal-rich layer and the second metal oxide layer is an oxygen-rich layer.

19. The manufacturing method of the resistive random access memory according to claim 10, wherein a forming method of the plurality of unit structures comprises:

forming an electrode material layer on the substrate;

forming a metal oxide material layer on the electrode material layer;

patterning the electrode material layer and the metal oxide material layer to form a plurality of units; and forming the spacer on sidewalls of the plurality of units.

20. The manufacturing method of the resistive random access memory according to claim 19, wherein a patterning method of the electrode material layer and the metal oxide material layer comprises performing a double patterning process.

* * * * *